United States Patent
Palaskas et al.

(10) Patent No.: US 7,657,232 B2
(45) Date of Patent: Feb. 2, 2010

(54) OFFSET-FREQUENCY LOOP-BACK CALIBRATION

(75) Inventors: Georgios Palaskas, Portland, OR (US); Stefano Pellerano, Beaverton, OR (US); Ashoke Ravi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 673 days.

(21) Appl. No.: 11/522,599

(22) Filed: Sep. 18, 2006

(65) Prior Publication Data

US 2008/0070512 A1    Mar. 20, 2008

(51) Int. Cl.
H04B 17/00 (2006.01)
H04B 1/00 (2006.01)
H04B 15/00 (2006.01)
H04B 1/06 (2006.01)

(52) U.S. Cl. .............. 455/67.11; 455/67.13; 455/275; 455/63.1

(58) Field of Classification Search ............. 455/78, 455/275, 276.1, 67.11, 67.16, 69, 70, 67.13, 455/501, 63.1
See application file for complete search history.

(56) References Cited

U.S. PATENT DOCUMENTS 6,996,375 B2 * 2/2006 Dent et al. ............... 455/67.16

* cited by examiner

*Primary Examiner*—Eugene Yun
(74) *Attorney, Agent, or Firm*—Lee & Hayes, PLLC (57) ABSTRACT

Embodiments of methods and means for calibrating a linearization characteristic within an RF transceiver system are provided. Such embodiments generally include extracting a portion of an output signal and frequency shifting or translating that signal by a predetermined value. The frequency shifted signal is then summed or otherwise introduced into a receiver signal pathway where it is analyzed by digital signal processing or other means to determine if linearization distortion is present. Linearization calibration of a power amplifier, a low-noise amplifier and/or other functionality within the system can then be performed in an automatic, reliable and ongoing manner.

15 Claims, 7 Drawing Sheets

OFFSET-FREQUENCY LOOP-BACK CALIBRATION

BACKGROUND

A power amplifier tends to dissipate significant amounts of power. This is particularly true for linear power amplifiers such as those used to process orthogonal frequency-division multiplexing (OFDM) signals including both phase and amplitude information. Linearization techniques can be used to improve the linearity and efficiency of a power amplifier. As one example, a popular linearization technique uses digital predistortion to correct the amplitude and phase distortion that occurs in the power amplifier.

A common problem with known linearization techniques is determining how to make them track (i.e., adjust, or account for) variations in fabrication, temperature, environmental influences, aging, and other factors. To overcome this problem, a calibration scheme has been employed that adjusts the linearization settings to the current state of the power amplifier. In one exemplary scheme, the output signal of the power amplifier is "looped-back" through the receiver section of the overall circuitry and analyzed using digital signal processing techniques, so that calibration of the power amplifier might be performed.

However, this approach often suffers from being too sensitive to incidental and/or unintentional coupling between the input and/or output of power amplifier signals, and the signals of the receiver input circuitry. In another case, non-linearities of a functional block or blocks other than the power amplifier can disrupt or alter the looped-back signal content. As a result of any or all of these disturbances, the digital signal processing and/or other calibration means can exert an erroneous calibration effect on the power amplifier linearization adjustment.

DETAILED DESCRIPTION

Figure 1:
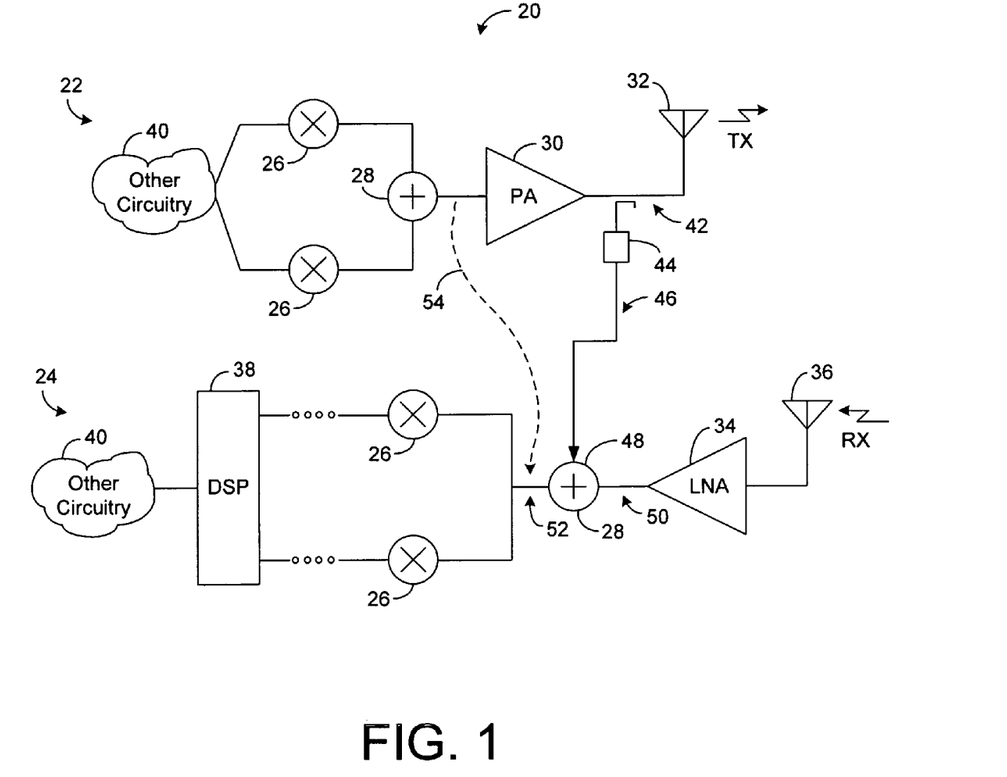
FIG. 1 illustrates a partial transceiver topology.

Consider FIG. 1 which depicts typical transceiver circuitry generally at 20. The transceiver 20 is understood to be typical of a multiple-carrier radio frequency (RF) system, such as an OFDM-based device, Wi-Fi® or WiMAX device, cellular component, a device or system compliant with IEEE 802.16, etc. Wi-Fi is a registered trademark owned by Wireless Ethernet Compatibility Alliance, Inc., Austin, Tex., USA. The transceiver 20 includes a transmitter portion (i.e., section) 22 and a receiver section 24. The transceiver 20 also includes a plurality of mixers 26 and summation blocks (i.e., "summers") 28. The mixers 26 and summers 28 are substantially generic functional blocks and are readily appreciated by one of ordinary skill in the wireless telecommunication arts, and further elaboration is not required for purposes of understanding the present teachings.

The transmitter portion 22 of the transceiver 20 also includes a power amplifier 30. The power amplifier 30 can be defined by, for example, a linear power amplifier configured to amplify a multi-carrier (i.e., frequency division) RF signal for purposes of driving a transmission antenna 32. Other types of power amplifier 30 can also be used. In any case, the power amplifier 30 exhibits a linearization characteristic that is subject to adjustment by way of calibration means of the transceiver 20 as described in greater below.

The transceiver 20 of FIG. 1 further includes a low-noise amplifier 34. The low-noise amplifier is understood to be a part of the receiver section 24 of the transceiver 20 and is close-coupled to a receiving antenna 36. The low-noise amplifier 34 can be defined by any suitable form of amplifier designed to amplify weak signals incident to the antenna 36. One of skill in the related arts will appreciate that the low noise amplifier 34 and antenna 36 comprise and arrangement generally referred to as an "active antenna", and that such serves to overcome losses that can occur, say, within a coaxial feedline (not shown) between the antenna 36 and low noise amplifier 34.

The transceiver 20 of FIG. 1 also includes a digital signal processing section (or processor) 38. The digital signal processor 38 can be defined by any suitable combination of signal handling and/or processing functions such as, for example, received signal de-multiplexing, signal decoding, linearization analysis, etc. These and other necessary and/or desired functions can be provided to the transceiver 20 by way of the digital signal processor 38. The transceiver 20 also includes various other circuitry 40 as a part of its overall operating functionality. By way of example, and not limitation, such other circuitry 40 can include additional digital signal processing blocks, amplification, audio signal circuitry, user interface components, power supplies and/or batteries, etc.

Certain typical operations of the transceiver 20 transpire as follows: the power amplifier 30 amplifies a final signal, thus deriving an output signal 42 that drives the transmission antenna 32. The output signal 42 is also coupled to an attenuator 44. The attenuator 44 serves to reduce the strength of the output signal 42 by a predetermined value or factor (e.g., 20 dB reduction, etc.) so as to derive a portion, or partial-strength version, of the output signal 46. In another embodiment (not shown), the attenuator 44 is not present and the output signal 42 constitutes the portion of output signal 46. Use of the attenuator 44 serves to avoid overloading of receiver circuitry of the transceiver 20.

Still referring to FIG. 1, the portion of the output signal 46 is routed to a summation block 28 designated as summer 48. The summer 48 sums the portion of the output signal 46 with an output signal 50 provided by the low-noise amplifier 34, so as to derive a loop-back signal 52. This loop-back signal 52 is then routed on to corresponding mixers 26 and the digital signal processor 38 of the transceiver 20.

The digital signal processor 38 analyzes the loop-back signal 52 (or one or more other signals derived there from) to determine or quantify a linearization characteristic of the power amplifier 30. Thus, the digital signal processor 38 can determine if any amplitude, phase and/or frequency distortion is occurring at power amplifier 30 by way of the loop-back signal 52. One of ordinary skill in the signal processing arts can appreciate that numerous known methods and techniques can be applied in order to make such a determination. If the digital signal processor 38 does determine that such distortion is present (that is, outside of some predetermined performance criteria), then the digital signal processor 38 can adjust, or calibrate, one or more operating characteristics of the power amplifier 30.

In any case, a problem can occur during the foregoing exemplary operation. Specifically, unintentional coupling 54 of signals within the transmission section 22 and the loop-back signal 52 can occur, such that the linearization information within the loop-back signal 52 is essentially "trampled", or indistinguishable from other signal content. In another case, the loop-back signal is adversely affected by linearization errors within the low-noise amplifier 34. These and/or other problems can result from, or be compounded by, the attenuation applied to the output signal to avoid the receiver overloading problem discussed above. In any case, these factors can result in an erroneous linearization analysis by the digital signal processor 38 and/or mis-calibration of the power amplifier 30. A solution to these and other problems is contemplated next in regard to FIG. 2.

Exemplary First Embodiment

Figure 2:
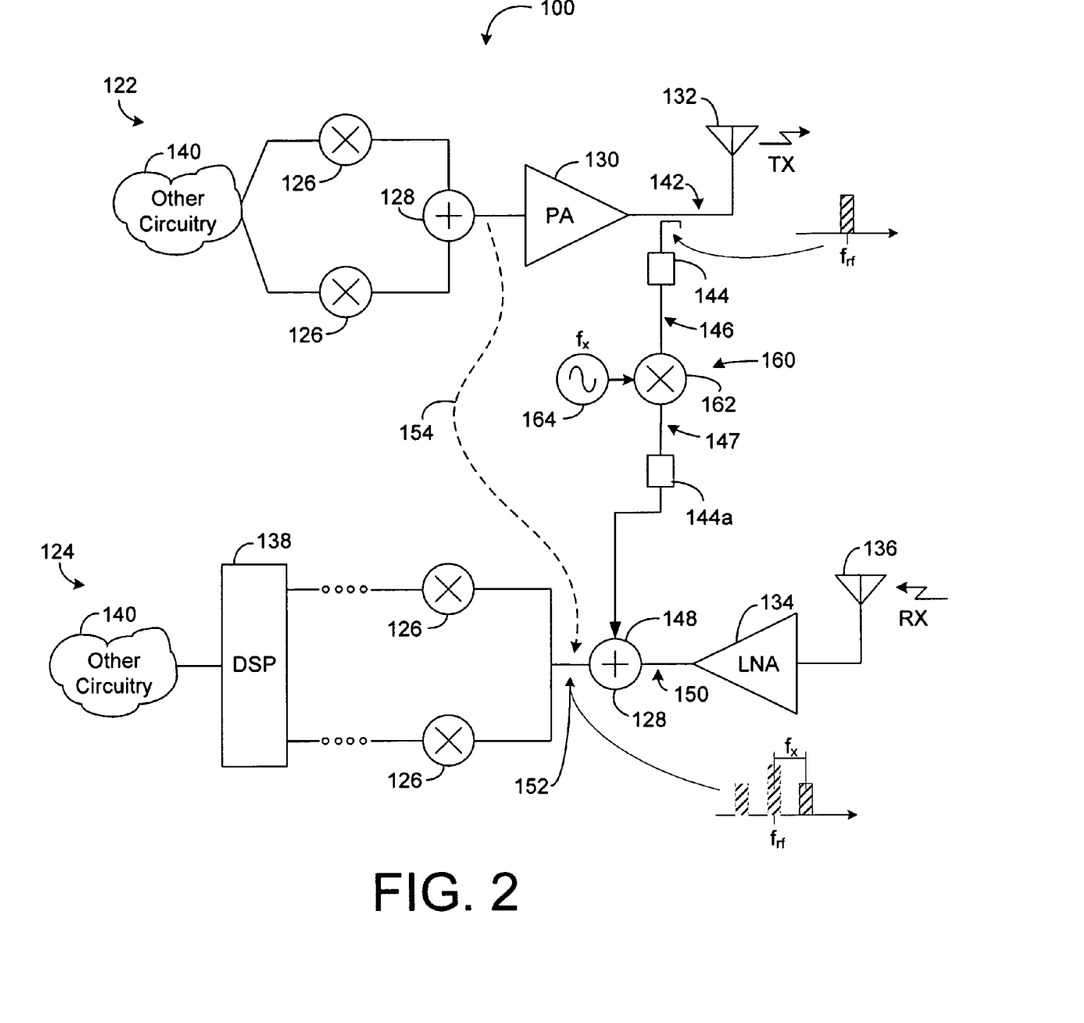
FIG. 2 illustrates a partial transceiver topology in accordance with one embodiment.

Reference is now made to FIG. 2, which depicts a transceiver 100 in accordance with one embodiment. The transceiver 100 includes mixers 126, summers (summation blocks) 128, a power amplifier 130, a low-noise amplifier 134, digital signal processing section (processor) 138 and other circuitry 140 that are respectively defined, configured and cooperative substantially as described above in regard to elements 26, 28, 30, 34, 38 and 40 of the transceiver 20 of FIG. 1. Thus, the transceiver 100 of FIG. 2 also includes a transmitter section 122 and a receiver section 124.

The transceiver 100 of FIG. 2 also includes a frequency translator section (hereinafter, translator) 160. As depicted in FIG. 2, the translator 160 comprises a mixer 162 and a frequency source (e.g., oscillator, etc.) 164. These and/or other suitable elements (not shown) can be used to define the translator 160. In any case, the translator 160 is configured to receive a portion of the output signal 146 by way of an (optional) attenuator 144 and perform a frequency shift operation thereon, so as to derive a shifted signal 147. Typically, the shifted signal 147 is offset above (and/or below) the center frequency of the receiver by a predetermined amount (shown as $f_x$) such as, for example, 20 MHz. Other offset values ($f_x$) can also be used.

This shifted signal 147 is then coupled via another (optional) attenuator 144a to a summer 148. The summer 148 sums the shifted signal 147 with an output signal 150 provided by the low-noise amplifier 134, so as to derive a loop-back signal 152. This loop-back signal 152 is routed on to corresponding mixers 126 and eventually to the digital signal processor 138 of the transceiver 100.

Among other possible functions performed by the digital signal processor 138 of FIG. 2, a determination is made of a linearization characteristic of the power amplifier 130. In this way, the digital signal processor 138 determines if any amplitude, phase and/or frequency distortion is occurring at power amplifier 130 by way of the loop-back signal 152. If the digital signal processor 138 determines that indeed such distortion is present, as compared to some predetermined criteria, then the digital signal processor 138 can adjust or otherwise affect calibration of one or more operating characteristics of the power amplifier 130. Such calibration can be affected, for example, by altering one or more power amplifier 130 operating coefficients within a lookup table (not shown), through adjustment of one or more bias signals (not shown) within the power amplifier 130, and/or by way of any other suitable control signaling so as to correct the operating performance of the power amplifier 130. The calibration of the power amplifier 130 of FIG. 2, as performed by way of the digital signal processor 138, is generally performed during a transmission phase of operation of the transceiver 100 and is not performed (typically) during the receiving of signals.

In contrast to the problems described above, the frequency-shifted signal 147 results in a loop-back signal 152 the permits ready detection and determination (i.e., quantization, etc.) of a linearization characteristic of the power amplifier 130. Unintentional coupling 154 that may occur between the loop-back signal 152 and any one or more signals present within the transmitter section 122 is mitigated with respect to the determination by virtue of the translator 160. That is, the determination is substantially insensitive to, or is not adversely affected by, such unintentional coupling 154. As a result, automatic linearization calibration of the power amplifier 130 can be performed in a reliable and ongoing (i.e., periodic, etc.) fashion.

In addition to the unintentional coupling (e.g., 154) problem described and resolved above, linearization problems can occur within the low-noise amplifier (e.g., 134) of a transceiver. Fortunately, methods and means of FIG. 2 can be used and/or modified to overcome problems of this nature, as well. For example, by momentarily disabling (e.g., decoupling, or driving to zero) the output signal 150 provided by the low-noise amplifier 134, the digital signal processor 138 ultimately sees and analyzes a loop-back signal 152 that is free from any linearization effects that can be present in the low-noise amplifier 134. Under such a scheme, any calibration adjustments determined by the digital signal processor 138 are essentially immune to linearization errors within the low-noise amplifier 134.

As to another aspect, reference is again made to FIG. 2. In accordance with one embodiment, one or more operating characteristics of the low-noise amplifier 134 can be adjusted instead of, or in addition to, calibration adjustments made to the power amplifier 130. Such linearization calibration of the low-noise amplifier 134 can be affected by any suitable method or means such as, for example, adjusting one or more operating coefficients within a corresponding lookup table, adjusting one or more bias signals within the low-noise amplifier 134, etc. Other signaling and/or control means can also be used to calibrate the low-noise amplifier 134. In this way, the methods and means of the present teachings are intended to be broadly applicable to one or more portions of a transceiver apparatus (e.g., 100 of FIG. 2) so as to facilitate automatic and ongoing linearization adjustment.

One of skill in the related arts can appreciate from the foregoing that certain other procedures may be used in order to achieve satisfactory or optimum results. For example, it may be desirable to bypass any channel selection filters (not shown) that are present during calibration operations if the loop-back signal falls within the stopband of such elements. In another exemplary case, it may be desirable to turn off (i.e., decouple, or deactivate) the low-noise amplifier (e.g., 134) during calibration so as to prevent nearby channels from interfering with the loop-back signal. In yet another example, it may be desirable to manually or automatically set transmit-receive (i.e., TX-RX) circuitry within the subject transceiver to the transmit position during calibration in accordance to the techniques provided herein. Other variations are readily contemplated by these teachings.

Exemplary Second Embodiment

Figure 3:
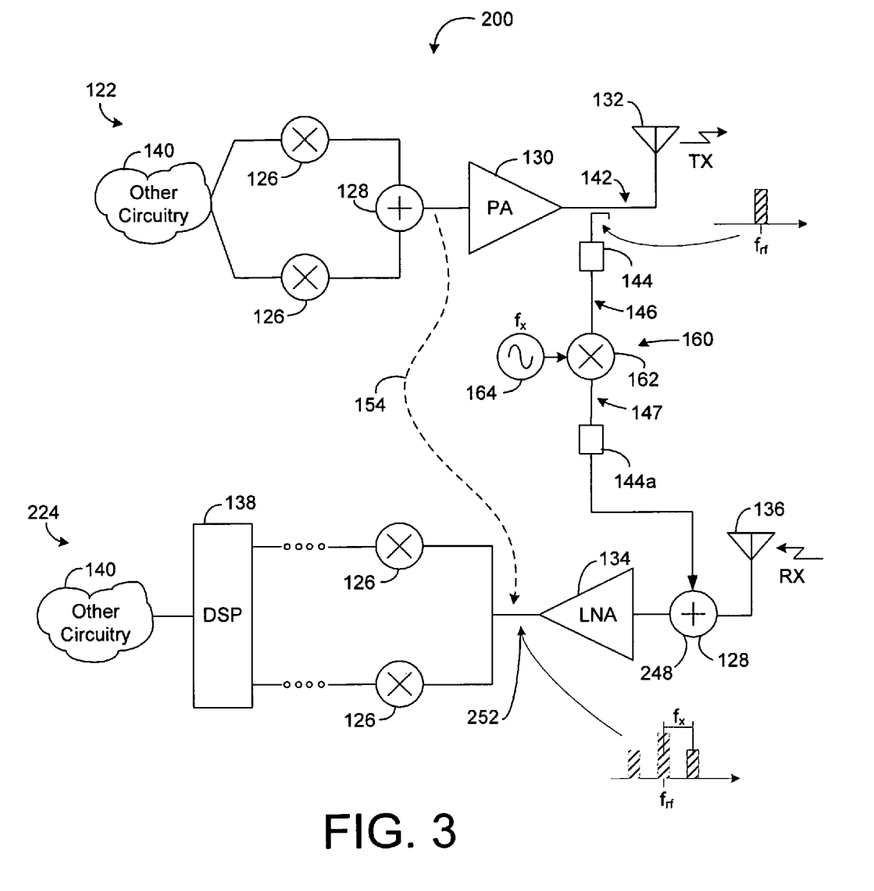
FIG. 3 illustrates a partial transceiver topology in accordance with another embodiment.

FIG. 3 depicts a transceiver 200 in accordance with another embodiment. The transceiver 200 includes elements 126-140, 144-144a and 160-164 as defined, configured and cooperative substantially as described above in regard to the transceiver 100 of FIG. 1, except as described below.

Transceiver 200 includes a summation block (summer) 248 coupled to the input of the low-noise amplifier 134. In this way, the shifted signal 147 is summed with whatever input signal is present at the receiving antenna 136, rather than the output signal of the low-noise amplifier 134. The resulting summation signal is amplified by the low-noise amplifier 134 in order to derive a loop-back signal 252. The loop-back signal is then routed on to summers 126 and digital signal processor 138, etc., of the receiving section 224 of the transceiver 200. Analysis of the loop-back signal 252 by the digital signal processor 138 and linearization calibration of the power amplifier 130 and/or low-noise amplifier 134 is then performed substantially as described above in regard to the transceiver 100 of FIG. 2.

Exemplary Third Embodiment

Figure 3A:
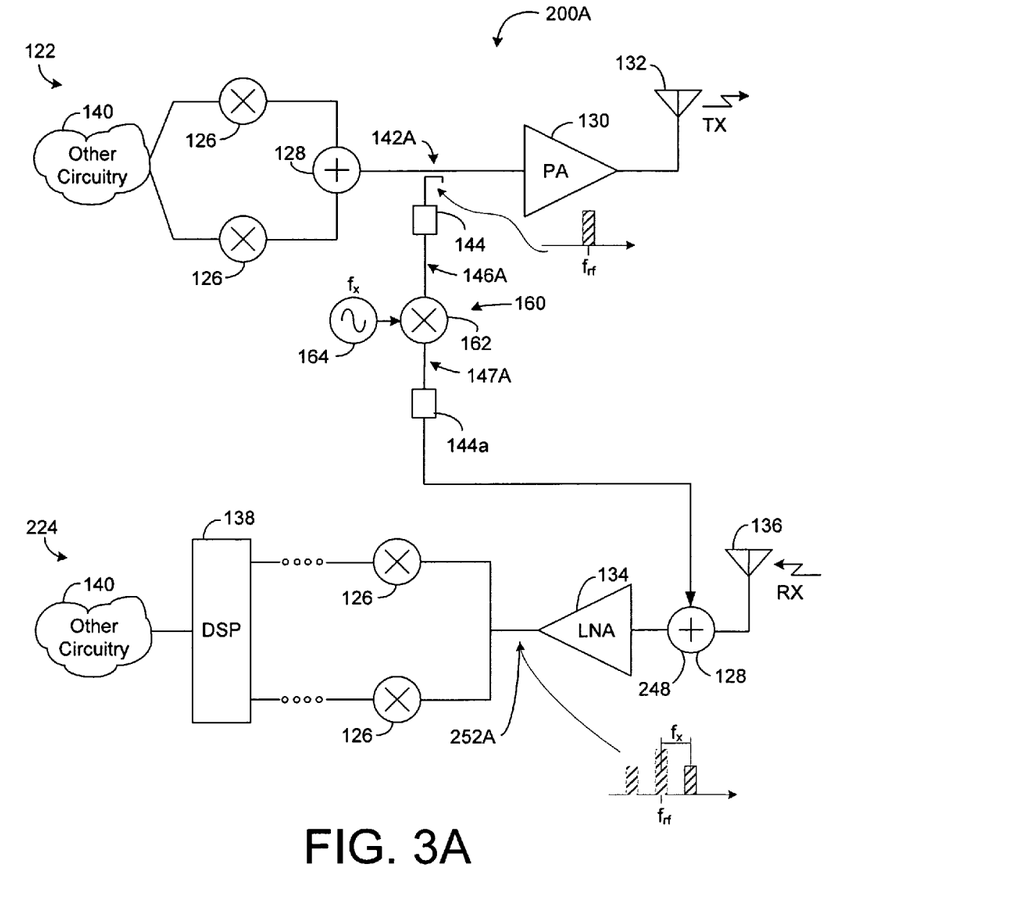

FIG. 3A depicts a transceiver 200A in accordance with another embodiment. The transceiver 200A is substantially elementally and cooperatively equivalent to the transceiver 200 of FIG. 2, except as described below.

The transceiver 200A is configured such that an output signal 142A is coupled (or extracted) from the input (i.e., before) the power amplifier 130. Therefore, the output signal 142A has not been amplified by and is not representative of any linearization effects corresponding to the power amplifier 130. The output signal 142A is then coupled through an (optional) attenuator 144 so as to derive a portion of the output signal 146A substantially as described above in regard to the signal 146 of FIG. 2. A shifted signal 147A is derived by way of the translator 160 (as previously described) and is routed onto the summer 248. A resultant loop-back signal 252A includes signal content representative of linearization characteristics of the low-noise amplifier 134 of the transceiver 200A. The loop-back signal 252A is then routed on to summers 126 and to the digital signal processor 138. Analysis of the loop-back signal 252A by the digital signal processor 138 and linearization calibration of the low-noise amplifier 134 is then performed substantially as described above in regard to the transceiver 100 of FIG. 2.

The embodiment of FIG. 3A provides for calibrating a low-noise amplifier 134, as is typically present within a receiver section (e.g., 224) of an RF transceiver (e.g., Wi-Fi, WiMAX, etc.). The output signal 142A used therein has not been amplified by, and is not representative of, any linearization effects corresponding to the power amplifier 130. Thus, the embodiment depicted by FIG. 3A provide means for automated calibration so as to mitigate any unintentional coupling between transmitter and receiver pathway signals, as well as any linearization effects that may be present in a power amplifier of the transmitter section (e.g., 122) of a transceiver device. In an alternate embodiment (not shown), the shifted signal (e.g., 147A) is introduced (summed) into the receiver signal pathway at the output of the low-noise amplifier rather than at the input as illustrated in FIG. 3A.

Exemplary Methods

Figure 4:
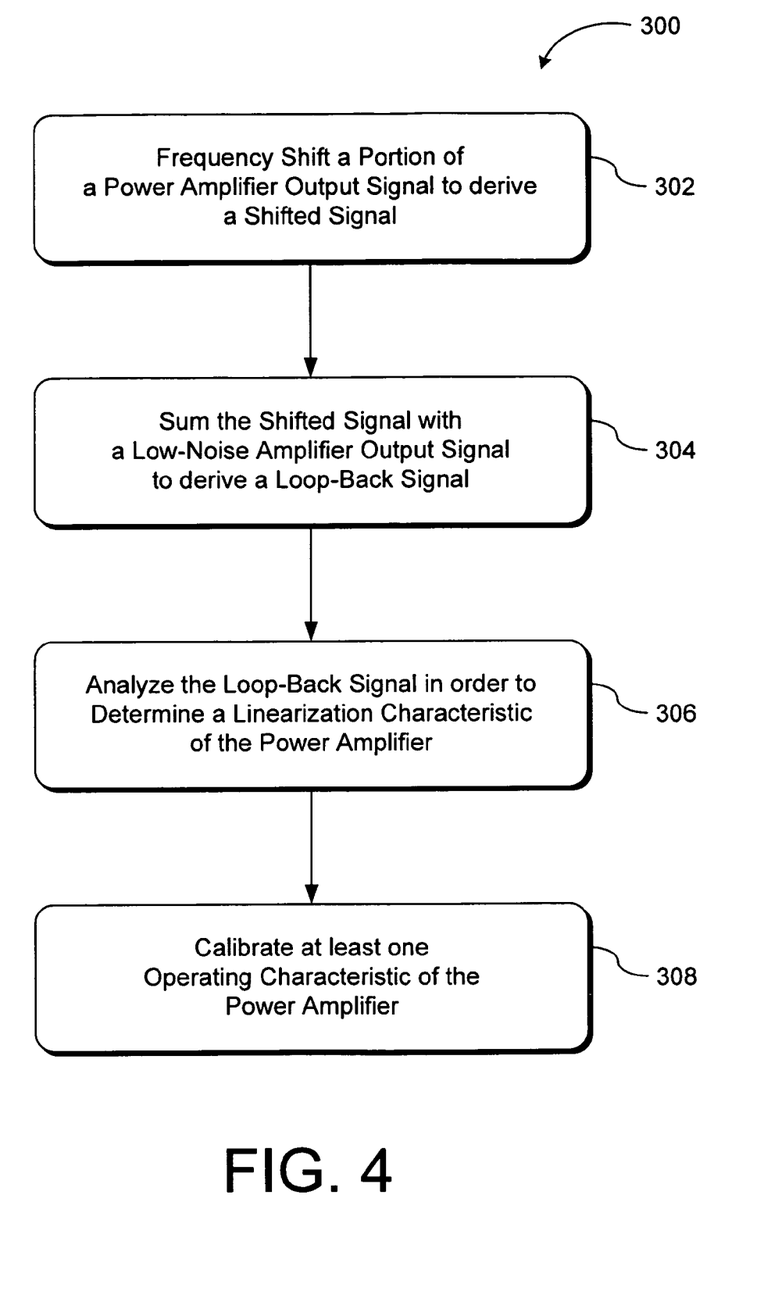
FIG. 4 illustrates method steps according to an embodiment.

FIG. 4 depicts a flowchart 300 that describes a method in accordance with one embodiment. In describing the method of flowchart 300, reference is made to the transceiver 100 of FIG. 2 in the interest of clarity. It is to be understood, however, that the method of flowchart 300 is contemplated to be broadly applicable to a vast range of transceiver or transmitter/receiver RF systems, and is not limited in its use only in connection with the exemplary embodiment of FIG. 2.

At 302, a portion of an output signal (e.g. 146 of FIG. 2) from a power amplifier (e.g., 130) of a transmitter section of a transceiver (e.g., 100) (or a discrete transmitter) is frequency shifted so as to derive a shifted signal (e.g., 147). Such frequency shifting can be accomplished by any suitable know means such as, for example, use of a translator (e.g. 160) comprising a mixer and offset frequency source (e.g., 162 and 164), etc. Herein, such frequency shifting means are also referred to as frequency translating means.

At 304, the shifted signal derived at 302 above is summed with an output signal (e.g., 150 of FIG. 2) from a low-noise amplifier (e.g., 134) within a receiver section of a transceiver (or a discrete receiver) so as to derive a loop-back signal (e.g., 152). Thus, the loop-back signal includes both shifted signal content and possibly, depending upon the particular mode of operation, low-noise amplifier signal content as well. In one embodiment, the output signal of the low-noise amplifier is nullified during the summation step such that the loop-back signal is predominantly or exclusively comprised of the shifted signal from step 302 above. Other embodiments can employ other modes of operation.

At 306, the loop-back signal of 304 above is analyzed to determine a linearization characteristic of the power amplifier (e.g., 130 of FIG. 2). This analysis is typically performed by a digital signal processor or processing section (e.g., 138) of the associated transceiver. Such an analysis seeks to detect phase, amplitude and/or frequency distortion within the output signal (e.g. 142) of the power amplifier (e.g., 130) resulting from non-linearity or related system effects. In one embodiment, the digital signal processor derives an Error Vector Magnitude characteristic of the power amplifier output signal for comparison against predetermined performance criteria. Other linearization analysis and/or detection techniques can also be used.

At 308, the digital signal processor (e.g., 138 of FIG. 2) or other associated circuitry calibrates at least one operating characteristic of the power amplifier (e.g., 130) in response to the linearization determination of 306 above. This calibration can take the form of adjusting (altering) performance or operating coefficients within a lookup table associated with the power amplifier, adjustment of biasing currents and/or voltage within the power amplifier, or any other adjustable signaling means suitable to the embodiment of the associated transceiver (e.g., 100) or transmitter.

The method of the flowchart 300 just described is particular to one or more embodiments. Other methods, such as described hereinafter, are also contemplated.

Figure 5:
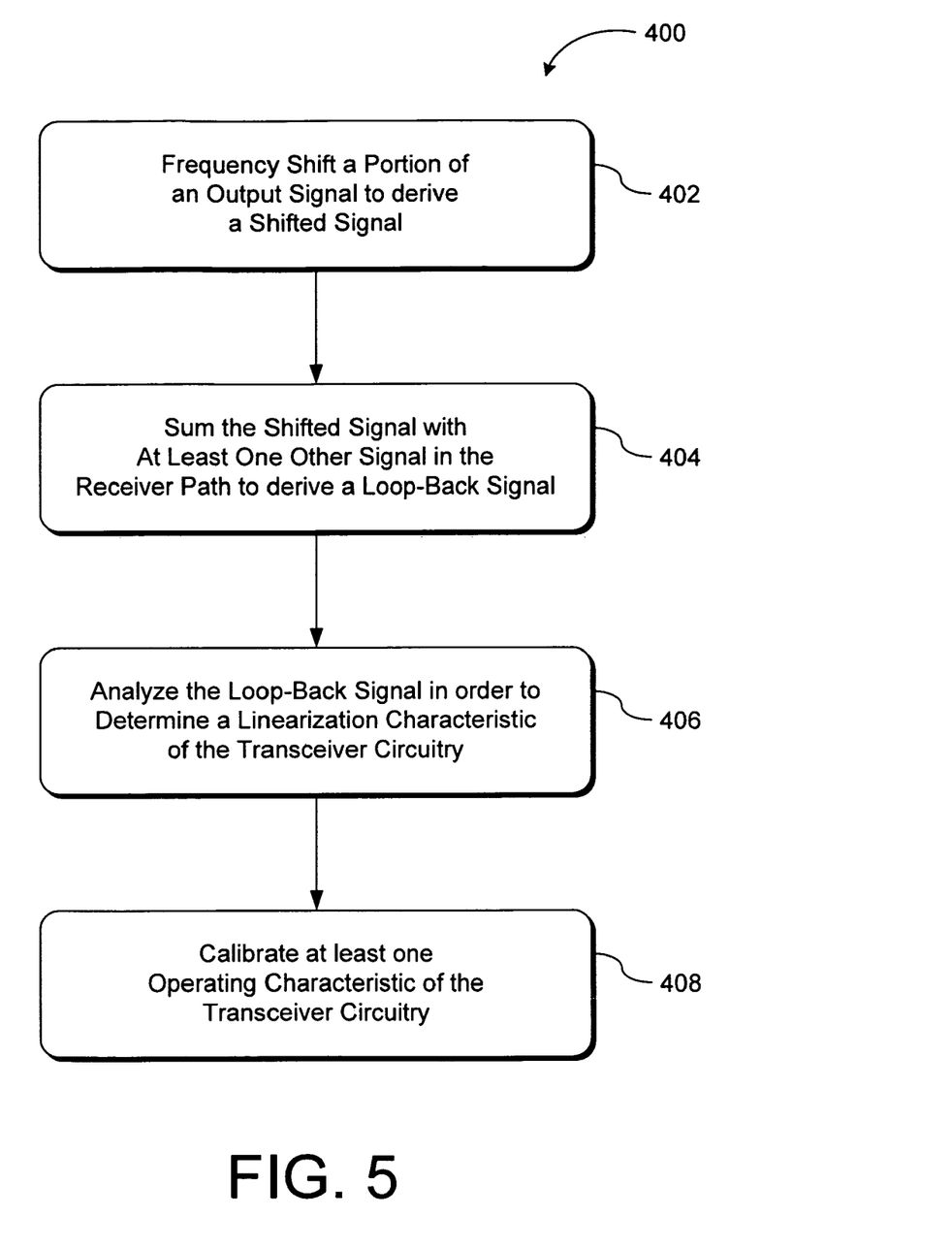
FIG. 5 illustrates methods steps according to another embodiment.

FIG. 5 depicts a flowchart 400 in accordance with another embodiment. In describing the method of flowchart 400, reference is made to the transceiver 200 of FIG. 3 in the interest of understanding. It is to be understood, however, that the method of flowchart 400 is contemplated to be broadly applicable to a vast range of transceiver or transmitter/receiver RF systems, and is not limited in its use to the exemplary embodiment of FIG. 3.

At 402, a portion of an output signal (e.g. 146 of FIG. 3) is extracted, or coupled, from either the input or output of (i.e., either before or after) a power amplifier (e.g., 130) of a transmitter section of a transceiver (e.g., 200) (or a discrete transmitter). The extracted signal is frequency shifted so as to derive a shifted signal (e.g., 147). Such frequency shifting can be accomplished by any suitable known means such as, for example, use of a mixer and offset frequency source, etc. Other suitable frequency shifting (translating) means can also be used.

At 404, the shifted signal (e.g., 147 of FIG. 3) is summed with at least one other signal in a receiver signal pathway associated with the transceiver (e.g., 200) or a discrete receiver in cooperation with the transmitter section discussed at 402 above. Such other signal or signals can comprise, for example, received signals from an antenna (e.g., 136), etc. In any case, the shifted signal is introduced into the receiver path and a loop-back signal (e.g., 252) is derived corresponding to the system element or elements to be calibrated.

At 406, the loop-back signal (e.g., 252 of FIG. 3) is analyzed using a digital signal processor or other circuitry (e.g., 138) to determine a linearization characteristic of the power amplifier, a low-noise amplifier, and/or other functional assets of the transceiver under scrutiny. Again, such a linearization determination can consider phase, magnitude and/or frequency aspects of a power amplifier, etc. In any event, a calibration correction is derived as a result of detecting any non-linearities presented by the loop-back signal.

At 408, at least one operating characteristic of the transceiver (or transmitter/receiver cooperative pair) is calibrated in accordance with the determination made at 406 above. In one embodiment, the operating characteristics of a low-noise amplifier (e.g., 134 of FIG. 3) are calibrated. In another embodiment, the operating characteristics of the power amplifier are calibrated. In yet another embodiment, both the low-noise amplifier and power amplifier are respectively calibrated. In still another embodiment, filter sections (not shown) and/or other functionality of the transceiver are calibrated. Such calibrations can respectively be performed by way of manipulating coefficient values within a corresponding lookup table, altering bias signals within an amplifier or other component or functional block, etc. Other signaling techniques effective to perform a linearization calibration can also be used. In any case, the result of step 408 is that one or more linearity aspects of the overall transceiver (e.g., 200) or transmitter/receiver pair is calibrated (corrected) back to or toward predetermined operating criteria.

Exemplary System

Figure 6:
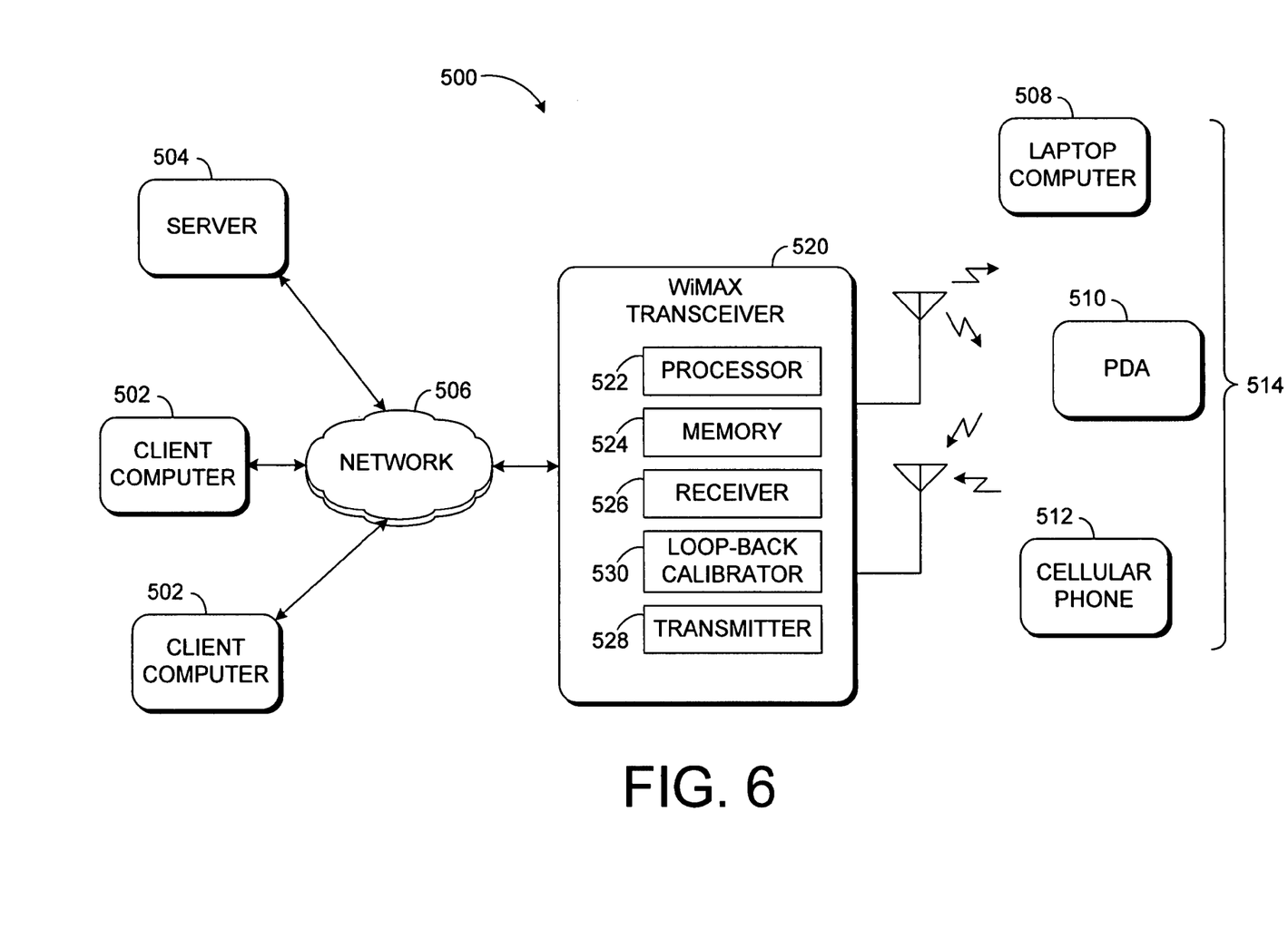
FIG. 6 illustrates an exemplary system according to yet another embodiment.

FIG. 6 depicts and exemplary system 500 according to another embodiment. System 500 is intended to exemplify but one of any number of possible systems inclusive of means and/or methods provided herein. Thus, the example system is understood to be illustrative and non-limiting in its overall teachings.

System 500 includes, in this example, a plurality of client computers 502 and a server 504 that are mutually coupled in communication to a network 506. The client computers 502, the server 504 and the network 506 are respectively defined by any suitable known such elements, and further elaboration is not required for purposes herein. Additionally, the network 506 can include, or be represented by, a connection to the Internet, a WAN, a LAN, etc.

The system 500 also includes a laptop computer 508, a personal digital assistant (PDA) 510 and a cellular phone 512. In addition to their respective conventional and widely understood capabilities, each of these elements 508512 is understood to include wireless functionality so as to selectively communicate with other devices (e.g., the client computers 502 or server 504, each other, etc) by RF wireless signaling. For the foregoing reason, the laptop 508, PDA 510 and cellular phone 512 are collectively referred to as wireless devices 514.

System 500 includes, in this example, a WiMAX transceiver (hereinafter, transceiver) 520. The transceiver 520 in turn includes a processor 522, memory 524, a receiver 526 and a transmitter 528. Each of the elements 522-528 can be defined by any suitable such functional elements, blocks and/or sub-system as suitable or desirable to provide conventional WiMAX wireless transceiver functionality. For example, and not by limitation, the processor 522 can be provided as a microprocessor or microcontroller configured to perform in accordance with one or more program code portions resident in the memory 524, such that normal operations of the transceiver are controlled and affected thereby. Continuing the non-limiting example, the receiver 526 and transmitter 528 can be provided as any suitable circuits and/or sub-systems under the control of the processor 522 that are respectively configured to receive and transmit wireless signals consistent with the WiMAX signaling format. Thus, elements 522-528 are exemplary of any number of possible overall device configurations.

Under normal operation, communication between any of the wireless devices 514, the client computers 502 and/or the server 504 are facilitated by way of the WiMAX transceiver 520. Such communication can include, for example: accessing the Internet (not shown) using the laptop computer 508 by way of the network 506; providing a word-processor document from the server 504 to the PDA 510; communicating a text message from the cellular phone 512 to the laptop computer 508; etc.

The transceiver 520 of the system 500 further includes a loop-back calibrator 530. The loop-back calibrator 530 is defined and configured consistent with any suitable teachings as provided herein. Thus, for example, the loop-back calibrator 530 can be configured and electrically interconnected so as to extract an output signal provided by the transmitter 528, perform frequency shifting (i.e., translation) thereon so as to derive a shifted signal, and then couple (introduce) that shifted signal into a signal pathway within the receiver 526 so that a loop-back signal is derived. In the ongoing example, the loop-back calibrator 530 is further configured to analyze the loop-back signal (or another signal including the loop-back signal content) and perform linearization calibration on one or more elemental aspects of the transmitter 528, the receiver 526, or both. In any cease, the loop-back calibrator 530 is configured to perform linearization calibration within the transceiver 520 in one or more fashions consistent with the teachings herein.

CONCLUSION

Embodiments and methods presented herein discuss solutions to non-linearity type (i.e., linearization) distortion that can occur within an RF transceiver system of, for example, a Wi-Fi, WiMAX, cellular, or other wireless venue. Generally, a portion of an output signal is extracted before or after a power amplifier and is frequency shifted before introduction into the receiver signal pathway, such that a loop-back signal is ultimately derived. Content of the loop-back signal is then analyzed to determine linearization characteristics of the power amplifier, a low-noise amplifier, and/or other components within the transceiver system, such that automatic, corrective calibration can be performed.

The frequency shifting aspect, in conjunction with the other means and methods, can provide a substantial degree of immunity from (i.e., mitigation of) unintentional signal coupling and/or unwanted linearization effects that can otherwise render analysis and/or calibration error-prone or reduced in effectiveness.

Although the embodiments have been described in language specific to structural features and/or methodological acts, it is to be understood that the subject matter defined in the appended claims is not necessarily limited to the specific features or acts described. Rather, the specific features and acts are disclosed as exemplary forms of implementing the claimed subject matter.

What is claimed is:

1. A method, comprising:
providing a circuit configured to provide an output signal, wherein the output signal is provided by a power amplifier of a transmitter section of a discrete transmitter of the circuit;
frequency shifting a portion of the output signal to derive a shifted signal;
summing the shifted signal and an other signal to derive a loop-back signal, wherein the other signal is provided by a low-noise amplifier within a discrete receiver of the circuit;
determining a linearization characteristic of the circuit by way of the loop-back signal, wherein determining the linearization characteristic of the circuit comprises a digital signal processor analyzing the loop-back signal to detect phase, amplitude and frequency distortion within the output signal of the power amplifier, wherein determining further comprises deriving an Error Vector Magnitude (EVM) characteristic of the output signal; and
calibrating at least one operating characteristic of the circuit responsive to the determination.

2. The method of claim 1, wherein the frequency shifting is performed by mixing the portion of the output signal with an offset frequency signal.

3. The method of claim 1, wherein the calibrating comprises adjusting one or more operating coefficients within a lookup table.

4. The method of claim 1, wherein the calibrating comprises adjusting at least one operating characteristic of the power amplifier or the low-noise amplifier of the circuit.

5. The method of claim 1, further comprising attenuating the output signal by a predetermined value to derive the portion of the output signal.

6. The method of claim 1, wherein the determining corresponds to a linearization characteristic of a predetermined portion of the circuit, the determining being performed so as to mitigate:
a linearization characteristic of another predetermined portion of the circuit; and
an unintentional coupling of the loop-back signal with any other signal.

7. An apparatus, comprising:
a circuit portion configured to provide an output signal;
a translator portion configured to frequency shift a portion of the output signal to derive a shifted signal;
a summation portion configured to sum the shifted signal and an other signal to derive a loop-back signal, wherein the other signal is provided by a low-noise amplifier within a discrete receiver of the apparatus; and
a signal processing portion configured to:
determine a linearization characteristic of the apparatus by way of the loop-back signal, wherein determining the linearization characteristic of the apparatus comprises a digital signal processor analyzing the loop-back signal to detect phase, amplitude and frequency distortion within the output signal of the power amplifier, wherein determining further comprises deriving an Error Vector Magnitude (EVM) characteristic of the output signal; and
calibrate at least one operating characteristic of the apparatus responsive to the determination.

8. The apparatus of claim 7, wherein the translator portion comprises a mixer.

9. The apparatus of claim 7, wherein the signal processing portion is further configured to perform the calibrating by adjusting one or more operating coefficients within a lookup table.

10. The apparatus of claim 7, wherein the signal processing portion is further configured to perform the calibrating by adjusting at least one operating characteristic of the power amplifier.

11. The apparatus of claim 7, further comprising a low-noise amplifier, wherein the signal processing portion is further configured to perform the calibrating by adjusting at least one operating characteristic of the low-noise amplifier.

12. The apparatus of claim 7, further comprising an attenuator coupled to the circuit portion and configured to attenuate the output signal by a predetermined value so as to derive the portion of the output signal.

13. The apparatus of claim 7, wherein the signal processing portion is further configured to determine a linearization characteristic of a predetermined portion of the apparatus, the signal processing portion also configured so as to mitigate:
a linearization characteristic of another predetermined portion of the apparatus; and
an unintentional coupling of the loop-back signal with any other signal.

14. A system, comprising:
a transceiver device comprising:
a processor configured to control one or more functions of the transceiver device;
a transmitter and a receiver respectively under the control of the processor; and
a loop-back calibrator in communication with the transmitter and the receiver, the loop-back calibrator configured to:
extract a portion of a signal present within the transmitter; frequency shift the extracted signal to derive a shifted signal; sum the shifted signal with an other signal present within the receiver so as to derive a loop-back signal, wherein the other signal is provided by a low-noise amplifier within the receiver; and
perform the determination of the linearization characteristic by way of analysis of the loop-back signal content
determine a linearization characteristic of the transceiver, wherein determining the linearization characteristic of the transceiver comprises a digital signal processor analyzing the loop-back signal to detect phase, amplitude and frequency distortion within the output signal of the power amplifier, wherein determining further comprises deriving an Error Vector Magnitude (EVM) characteristic of the output signal; and
adjust at least one operating characteristic of the transceiver device responsive to the determination;
wherein the loop-back calibrator is configured to mitigate unintentional signal coupling within the transceiver.

15. The system of claim 14, wherein:
the transmitter comprises a power amplifier;
the receiver comprises a low-noise amplifier; and
the loop-back calibrator is further configured such that the determination corresponds to a linearization characteristic of one or more of the power amplifier, or the low-noise amplifier.

* * * * *

UNITED STATES PATENT AND TRADEMARK OFFICE
CERTIFICATE OF CORRECTION

PATENT NO. : 7,657,232 B2
APPLICATION NO. : 11/522599
DATED : February 2, 2010
INVENTOR(S) : Palaskas et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 807 days.

Signed and Sealed this

Twenty-eighth Day of December, 2010

David J. Kappos
*Director of the United States Patent and Trademark Office*